United States Patent [19]

Wallbillich et al.

[11] Patent Number: 4,948,702

[45] Date of Patent: Aug. 14, 1990

[54] PHOTOSENSITIVE RECORDING ELEMENT

[75] Inventors: Guenter Wallbillich, Neustadt; Peter Neumann, Wiesloch; Guenter Hansen, Ludwigshafen, all of Fed. Rep. of Germany

[73] Assignee: BASF Aktiengesellschaft, Ludwigshafen, Fed. Rep. of Germany

[21] Appl. No.: 363,420

[22] Filed: Jun. 5, 1989

Related U.S. Application Data

[63] Continuation of Ser. No. 273,636, Nov. 18, 1988, abandoned, which is a continuation of Ser. No. 16,849, Feb. 20, 1987, abandoned.

[30] Foreign Application Priority Data

Feb. 20, 1987 [DE] Fed. Rep. of Germany ....... 3606266

[51] Int. Cl.$^5$ ................................................ G03C 1/76
[52] U.S. Cl. ..................................... 430/271; 430/281; 430/300; 430/510; 430/512; 430/517; 430/522
[58] Field of Search ............... 430/271, 281, 300, 510, 430/512, 517, 522

[56] References Cited

U.S. PATENT DOCUMENTS

| | | |
|---|---|---|
| 2,791,504 | 5/1957 | Plambeck . |
| 3,512,984 | 5/1970 | Amano et al. ................ 430/512 |
| 4,126,466 | 11/1978 | Roos . |
| 4,173,673 | 11/1979 | Bratt et al. . |
| 4,337,308 | 6/1982 | Franke . |
| 4,370,405 | 1/1983 | O'Toole et al. . |

FOREIGN PATENT DOCUMENTS

| | | |
|---|---|---|
| 407282 | 4/1966 | Australia . |
| 0013750 | 8/1980 | European Pat. Off. . |
| 2405855 | 8/1974 | Fed. Rep. of Germany . |
| 1001831 | 8/1965 | United Kingdom . |
| 1114944 | 5/1968 | United Kingdom . |
| 1452986 | 10/1976 | United Kingdom . |

OTHER PUBLICATIONS

Microelectronic Engineering, vol. 3, No. 114 (1985), pp. 321–328.

Venkataraman, K., The Chemistry of Synthetic Dyes, In: Organic and Biological Chemistry, vol. I, Fieser & Fieser, Eds., 1952, Academic Press Inc., N.Y., Chapter XX, Stibene Dyes., pp. 628–636.

*Primary Examiner*—Jack P. Brammer
*Attorney, Agent, or Firm*—Keil & Weinkauf

[57] ABSTRACT

A photosensitive recording element possessing a photosensitive recording layer which is applied to a dimensionally stable base, if desired on top of one or more intermediate layers, and has good photochemical properties and a long shelf life contains special sulfo-containing azo or azoxy dyes for controlling the photochemical properties in the photosensitive recording layer and/or in any intermediate layer present. Dyes which are suitable for use according to the invention can be obtained, for example, by autocondensation of 5-nitro-o-toluenesulfonic acid.

13 Claims, No Drawings

PHOTOSENSITIVE RECORDING ELEMENT

This application is a continuation of application Ser. No. 273,636, filed on Nov. 18, 1988, now abandoned, which is a continuation of application Ser. No. 016,849, filed on Feb. 20, 1987, now abandoned.

The present invention relates to a photosensitive recording element, particularly for the production of printing plates, relief plates or resist images, having a dimensionally stable base, a solid photosensitive recording layer applied on the base, and, if required, one or more intermediate layers between the base and the photosensitive recording layer, and containing a dye in the photosensitive recording layer or, where one or more intermediate layers are present between the base and the photosensitive recording layer, in the photosensitive recording layer and/or one or more of the intermediate layers.

Photosensitive recording elements of the stated type are used in reproduction technology, for example the production of printing plates or relief plates and resist images. The dimensionally stable bases conventionally used are plastic films or sheets or steel or aluminum sheets. Other substrates too, such as copper, copper-plated bases, circuit boards, semiconductor elements and the like, are used as bases for photosensitive resist layers. The single-layer or multilayer photosensitive recording layer may consist of a photodegradable material, so that, when exposed to actinic light, it becomes soluble in solvents in which it was previously insoluble; it may also consist of a photopolymerizable mixture in which, on exposure to actinic light, photoinitiated polymerization and crosslinking produce a differentiation in properties between unexposed and exposed areas, which can be utilized for the development of the printing plate, relief plate or resist image. In many cases, particularly when they are used for the production of printing plates or relief plates, the photosensitive recording elements contain, between the base and the photosensitive recording layer, one or more intermediate layers which, for example, may be in the form of adhesion-promoting layers and/or antihalation layers and can also be photosensitive or insensitive to light.

In order to control the photochemical processes during image production, for example to achieve a certain, desired relief structure, the known photosensitive recording elements generally contain, in the photosensitive recording layer and/or, where present, the intermediate layer or one or more of the intermediate layers, dyes or pigments which absorb in the wavelength range of light which is actinic for the photosensitive recording layer (cf., inter alia, U.S. Pat. No. 2,791,504, GB-A-1 001 831, DE-A-26 58 422, DE-A-22 02 360 and U.S. Pat. No. 4,173,673). In this connection, pigments have the disadvantage that they frequently cause undesirable light scattering or some of them are difficult to mix into the particular layer to give a homogeneous, uniform distribution. Hence, dyes are often preferred for controlling the exposure properties and other photochemical properties of the photosensitive recording elements. However, we have found that many of the dyes which as such are suitable and have also been described for this purpose are not migration-resistant, i.e. when such dyes are present in the various layers of the photosensitive recording element in graded concentrations, the dyes migrate, in accordance with the concentration gradient, with compensation of the different concentrations and hence also, in general, with a change or loss of the specifically established photochemical properties of the photosensitive recording elements. Although non-migrating dyes for photosensitive recording elements have also been described, very few dyes, in terms of both number and type, actually possess the desired stability to migration. There is therefore still a need for migration-resistant dyes for use in photosensitive recording elements for controlling the photochemical processes during their exposure.

It is an object of the present invention to provide photosensitive recording elements of the type under discussion, which possess very good exposure properties and a long shelf life and contain, in their photosensitive recording layer and/or in any intermediate layer present between the dimensionally stable base and the photosensitive recording layer, dyes for controlling the photochemical properties of these photosensitive recording elements, where the dyes may be present in the various layers of the said recording element in graded concentrations, without dye migration and a consequent change in the photochemical and exposure properties of the said recording elements occurring, even on prolonged storage.

We have found, surprisingly, that this object is achieved by photosensitive recording elements which contain, in their photosensitive recording layer and/or in any intermediate layer present between the dimensionally stable base and the photosensitive recording layer, special sulfo-containing azo and azoxy dyes of the type defined in detail below.

The present invention accordingly relates to a photosensitive recording element, in particular for the production of printing plates, relief plates or resist images, possessing (a) a dimensionally stable base,
(b) a solid photosensitive recording layer which is applied on the base and, if required,
(c) one or more intermediate layers between the base and the photosensitive recording layer, and containing a dye in the photosensitive recording layer or, where one or more intermediate layers are present, in the photosensitive recording layer and/or in one or more of the intermediate layers. The novel photosensitive recording element contains, as the dye, a compound of the general formula (I)

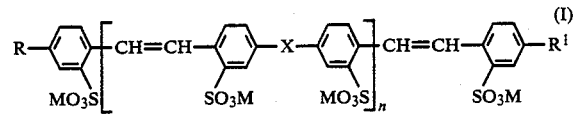

where X is an azo or azoxy group, M is hydrogen, an alkali metal cation, ammonium or an amine cation, R and $R^1$ are identical or different and independently of one another are each $-NO_2$, $-NH_2$, $-NHCOR^2$ (in which $R^2$ is hydrogen, unsubstituted or substituted alkyl, unsubstituted or substituted cycloalkyl, unsubstituted or substituted phenyl, alkoxy, phenoxy, a 5-membered or 6-membered heteroaromatic radical, $-NH_2$ or $-COOH$), $-NHSO_2R^3$ (in which $R^3$ is alkyl or phenyl) or $-N=N-R^4$ (in which $R^4$ is a radical of a coupling component), and n is an integer from 1 to 6 and, where R and/or $R^1$ is $-N=N-R^4$, may furthermore be 0.

We have found, surprisingly, that the special sulfo-containing azo or azoxy dyes used according to the invention are extremely migration-resistant in the photosensitive recording elements and can very advantageously be used for establishing the photosensitivity and the exposure properties and for controlling the photochemical processes in the photosensitive recording elements in other ways during their exposure to actinic light. The novel photosensitive recording elements furthermore have a long shelf life, during which the desired and specifically set exposure and image reproduction properties are not adversely affected or changed.

The dyes employed according to the invention can be used in a variety of ways to establish specific exposure and image reproduction properties of the novel photosensitive recording elements or to control the photochemical processes in the said recording elements in a specific manner during their exposure to actinic light.

For example, it is possible for the dyes used according to the invention to be present alone in the photosensitive recording layer of the photosensitive recording elements, in concentrations graded over the thickness of the said recording layer. The concentration of the dyes can increase or decrease from the outer surface of the photosensitive recording layer to the base. The said recording layer may be a single stratum or may consist of a plurality of strata having differentiated properties and different dye concentrations.

In photosensitive recording elements which contain an intermediate layer, for example an adhesion-promoting layer and/or an antihalation layer, between the dimensionally stable base and the photosensitive recording layer, the dye used according to the invention may be present only in the photosensitive recording layer or, in particular, only in this intermediate layer or in both the said recording layer and the intermediate layer, in graded concentrations. In the last-mentioned case, the concentration of the dye used according to the invention will as a rule be higher in the intermediate layer than in the photosensitive recording layer. It is of course also possible for the exposure properties of the novel photosensitive recording elements or the photochemical processes in the said recording elements during their exposure to actinic light to be controlled not only via the concentration but also via the type of dyes by, for example, incorporating, in the various layers of the photosensitive recording elements or in the individual layers of a multilayer photosensitive recording layer, dyes of the type according to the invention which have different absorptions.

Dyes which are present, according to the invention, in the photosensitive recording layer and/or in any intermediate layer of the photosensitive recording elements which may be present between the dimensionally stable base and the photosensitive recording layer are those of the general formula (I) shown above. In this formula, X is —N=N— or —N(O)=N— and M is a hydrogen atom or proton, an alkali metal cation, in particular a lithium, sodium or potassium cation, the $NH_4^{\oplus}$ cation or an amine cation, in particular $H_2N^{\oplus}R^5R^6$ or $HN^{\oplus}R^5R^6R^7$, where $R^5$ and $R^6$ or $R^5$, $R^6$ and $R^7$ may be identical or different and are each alkyl, in particular alkyl of 1 to 4 carbon atoms, or hydroxyalkyl, in particular hydroxyalkyl of 2 or 3 carbon atoms. Examples of preferred amine cations are $H_2N^{\oplus}(C_2H_5)_2$, $H_2N^{\oplus}(CH_3)CH_2CH_2OH$, $H_2N^{\oplus}(CH_2CH_2OH)_2$, $HN^{\oplus}(CH_2CH_2OH)_3$ and $HN^{\oplus}(CH_2-CHOH-CH_3)_3$.

The radicals R and $R^1$ in the general formula (I) may be identical or different and, independently of one another, are in particular $NO_2$ or $NH_2$. They may furthermore be a radical of the formula $-NHCOR^2$, where $R^2$ is, in particular, hydrogen, straight-chain or branched alkyl, preferably of 1 to 8 carbon atoms, in particular methyl or ethyl, substituted alkyl of the abovementioned type, e.g. benzyl, methoxymethyl or phenoxymethyl, cycloalkyl, in particular cyclohexyl, phenyl which is unsubstituted or substituted by, for example, one or two alkyl groups, in particular alkyl of 1 to 4 carbon atoms, alkoxy, in particular alkoxy of 1 or 2 carbon atoms, hydroxyl, halogen, in particular fluorine, chlorine or bromine, amino, nitro, cyano, trifluoromethyl, a $COOR^8$ group (where $R^8$ is hydrogen or alkyl, in particular alkyl of 1 to 4 carbon atoms), an $-SO_2R^9$ group (where $R^9$ is methyl, ethyl or phenyl), one or two $-SO_2NR^{10}R^{11}$ groups (where $R^{10}$ and $R^{11}$ are identical or different and independently of one another are each hydrogen, alkyl, in particular alkyl of 1 to 4 carbon atoms, hydroxyalkyl, in particular hydroxyalkyl of 2 or 3 carbon atoms, or phenyl), $-SO_3M$, $PO_3HM$ or $-PO_3M_2$ (where M has the above meanings) or an $-NH-CO-C_6H_5-NH_2$ group, or $R^2$ is, in particular, a heteroaromatic ring, in particular a 5-membered or 6-membered one, e.g. a furyl, 2,5-dimethylfuryl, thienyl or pyridyl, alkoxy, in particular alkoxy of 1 to 4 carbon atoms, phenoxy, $NH_2$ or carboxyl. R and $R^1$ in the general formula (I) may furthermore be a radical of the formula $-NHSO_2R^3$, where $R^3$ is alkyl, preferably alkyl of 1 to 4 carbon atoms, in particular methyl or ethyl, or phenyl which may be substituted by alkyl, in particular alkyl of 1 to 4 carbon atoms, e.g. methyl. Furthermore, R and $R^1$ in the general formula (I) may be, in particular, an $-N=N-R^4$ group, where $R^4$ is the radical of a coupling component which is preferably water-soluble. Examples of suitable coupling components from which the radical $R^4$ is derived are compounds of the benzene, naphthalene, pyrazolone, pyrazole, acetoacetarylide, barbituric acid, indole, benzimidazole, benzothiazole, quinolone, homophthalimide or pyridone series, examples of substituents for the coupling components essentially being hydroxyl, alkoxy, alkyl, aryl, unsubstituted or substituted amino, carboxyl, carboxamido, sulfo, sulfonamido, sulfonyl and phosphonic acid groups as well as halogen atoms; preferred coupling components from which the radical $R^4$ is derived include the coupling components of the benzene, e.g. aniline, and naphthalene series.

In the dyes of the general formula (I) which are employed according to the invention, n is an integer from 1 to 6, in particular from 1 to 3, but may furthermore be 0 if one or more of the radicals R and $R^1$ is an $-N=N-R^4$ group (where $R^4$ is a radical of a coupling component which is preferably water-soluble).

Particularly preferred dyes of the general formula (I) for use, according to the invention, in the photosensitive recording elements are those of the formula (I) where X, M and n have the above meanings and R and $R^1$ are identical or different and are each $-NO_2$, $-NH_2$, $-N=N-R^4$ (where $R^4$ is a radical of a water-soluble coupling component of the abovementioned type) or $-NHCOR^2$, where $R^2$ is hydrogen, $C_1-C_4$-alkyl, in particular methyl or ethyl, or phenyl which is unsubstituted or substituted by one or two methyl, methoxy or hydroxyl groups, amino, a $-COOR^8$ group (where $R^8$ is hydrogen or $C_1-C_4$-alkyl), an $-SO_3M$, $-PO_3HM$ or $-PO_3M_2$ group (where M has one of the meanings stated above for this substituent). Particularly preferred $-NHCOR^2$ groups for the radicals R and $R^1$ in the general formula (I) are those in which $R^2$ is methyl or ethyl or phenyl which is unsubstituted or substituted by methyl, amino or sulfo.

Very particularly preferred dyes for use, according to the invention, in the photosensitive recording elements, are compounds of the general formula (I) in which X is —N=N— or —N(O)=N—, M is hydrogen or a proton, an alkali metal cation, the ammonium cation or an amine cation of the type stated above, R and $R^1$ are identical or different and are each —$NO_2$ or —$NH_2$ and n is an integer from 1 to 3, as well as dyes of the formula (I) in which R and $R^1$ are each —N=N—$R^4$ (where $R^4$ is a radical of a water-soluble coupling component of the benzene or naphthalene series) and n is 0.

The dyes of the general formula (I) are known per se or can be prepared by a conventional method. Examples of these dyes which may be present in the photosensitive recording materials are described, inter alia, in Venkataraman, Chemistry of Synthetic Dyes, Vol. 1 (1952), page 628 et seq. Other suitable dyes according to the invention are disclosed in DE-A-24 05 855, DE-A-30 07 077 and EP-A-13 750 and can be prepared by the methods described there.

Examples of particularly preferred dyes to be used according to the invention are compounds of the general formula (I) as can be prepared by autocondensation of 5-nitro-o-toluenesulfonic acid, for example by the process described in DE-C-16 44 308. The dyes which are particularly preferred according to the invention include C.I. Direct Yellow 11 (C.I. 40000) as well as similar dyes and dyes prepared by a similar method.

Examples of very advantageous dyes to be used according to the invention include the compounds of the formulae (II), (III) and (IV) below.

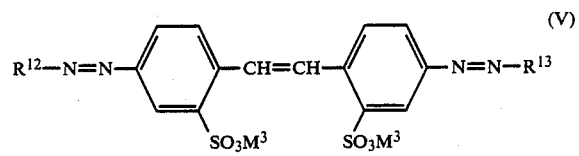

In formula (V), $M^3$ is the potassium cation and/or the $HN^{\oplus}(CH_2CH_2OH)_3$ cation and $R^{12}$ and $R^{13}$ independently of one another are each an o-cresotinic acid radical (1), an H acid radical (2) or a γ-acid radical (3)

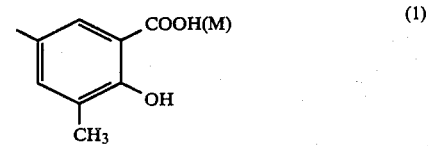

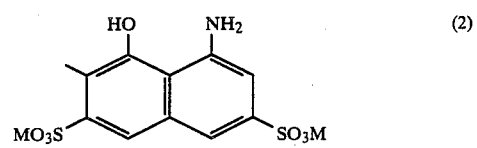

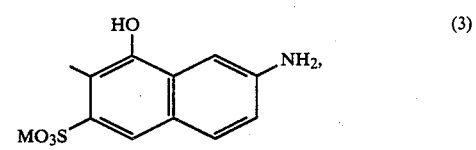

M having the above meanings in the radicals (1) to (3).

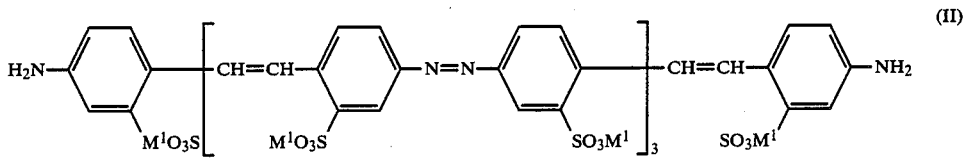

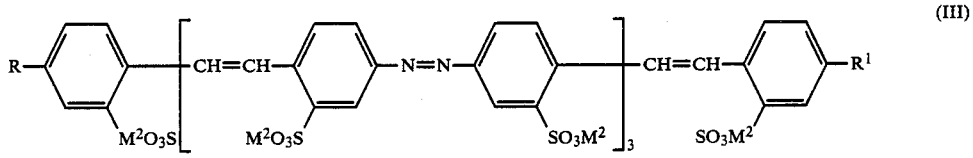

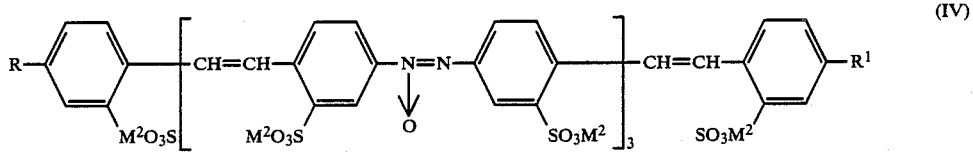

In the formula (II), $M^1$ is the $H_2N^{\oplus}(CH_2CH_2OH)_2$ cation. In the formulae (III) and (IV), $M^2$ is the $H_2N^{\oplus}(C_2H_5)_2$ cation and R and $R^1$ independently of one another are each —$NO_2$ or —$NH_2$.

Other examples of dyes of the general formula (I) which have proven very advantageous for use, according to the invention, in the photosensitive recording elements are the compounds of the formula (V) below The dyes of the formula (V) can be prepared using only a single coupling component or a mixture of two or more coupling components, a mixture of dyes being obtained in the latter case.

The dyes of the general formula (I) are present in the photosensitive recording layer and/or any intermediate layers of the novel photosensitive recording elements in amounts which are effective for establishing the desired photochemical properties and are conventionally used or can be determined readily by a few simple experiments. The concentration of the dyes in the layer or layers must be adapted, inter alia, to the intended use of the photosensitive recording elements (for example in letterpress, flexographic or gravure printing or as a photoresist), the thickness of the individual layers, the structure of the photosensitive recording elements (single-stratum or multistratum photosensitive recording layer, intermediate layers, etc.) and the type and intensity of the light source used for processing, and may accordingly vary within wide limits.

Regarding the composition of the novel photosensitive recording elements, the following may additionally be stated:

Suitable carriers for the photosensitive recording elements of the type under discussion are conventional, dimensionally stable, rigid or, preferably, flexible bases, the choice of which is determined, inter alia, by the intended used of the said recording elements. For example, plastic films or sheets, in particular consisting of polyesters, e.g. polyethylene terephthalate, as well as metal bases, for example steel or aluminum sheets, are particularly useful as dimensionally stable bases for the production of printing plates or relief plates. In these cases, the photosensitive recording layer is firmly bonded to the dimensionally stable base. To do this, the bases can, if required, be pretreated in a conventional manner, for example mechanically, chemically, electrochemically and/or by providing an adhesion-promoting layer. Preferably used bases for photoresist films and photosensitive film resist materials are plastic films or sheets, in particular polyester sheets, e.g. polyethylene terephthalate sheets, which exhibit moderate adhesion to the photosensitive recording layer and, after lamination of the said recording layer with the substrate, can be peeled off from the latter before or after exposure to actinic light. To produce resist images, the photosensitive recording layer can also be applied directly to the substrate to be protected and, where relevant, to be permanently modified, the said substrate then acting as a base for the photosensitive recording layer. Examples of suitable substrates for photosensitive resist layers are copper sheets, copper-plated bases, ceramic substrates coated with metallic or metal oxide layers, and semiconductor elements, silicon wafers and the like.

The photosensitive recording layer of the novel photosensitive recording elements can be positive-working or negative-working and they consist in principle of any materials conventionally used for such layers. Examples of such materials for the photosensitive recording layer are the known photodegradable materials and materials which, when exposed to actinic light, become soluble in solvents in which they were previously insoluble. These include, for example, the positive-working recording materials based on compounds containing o-quinonediazide groups, as described in, inter alia, DE-A-20 28 903, DE-A-22 36 914, U.S. Pat. Nos. 3,782,939, 3,837,860 and 4,193,797. These include, in particular, the photosensitive recording materials which contain, as the photosensitive component, a compound possessing two or more aromatic and/or heteroaromatic o-nitrocarbinol ester groups, as described in, for example, DE-C-21 50 691, DE-B-23 09 062, DE-A-29 22 746, U.S. Pat. Nos. 4,456,679, 4,465,760, EP-A-101 586 and EP-A-141 389.

The photosensitive recording layer of the novel photosensitive recording elements is preferably formed from a photopolymerizable mixture which contains not only one or more photopolymerization initiators but also one or more ethylenically unsaturated, photopolymerizable compounds; these compounds may be monomers or oligomers or polymers containing photopolymerizable or photocrosslinkable groups, and the photopolymerizable mixture preferably contains only ethylenically unsaturated, photopolymerizable compounds which possess two or more ethylenically unsaturated, photopolymerizable double bonds, or mixtures of these compounds with ethylenically unsaturated, photopolymerizable compounds containing only one ethylenically unsaturated, photopolymerizable double bond. The photopolymerizable mixtures may furthermore contain other components, in particular polymeric binders which are compatible with the ethylenically unsaturated, photopolymerizable compounds, thermal polymerization inhibitors, fillers, plasticizers, sensitometric regulators, photochromic compounds or systems and the like. Such photopolymerizable mixtures for photosensitive recording layers are sufficiently well known to the skilled worker and are described in the relevant technical literature.

Particularly advantageous in this context are the photosensitive photopolymerizable recording layers which can be developed with aqueous developers, i.e. the photosensitive recording layers which are formed from a photopolymerizable mixture which is soluble or dispersible in the aqueous developers. These photopolymerizable mixtures contain one or more saturated and/or unsaturated, photopolymerizable or photocrosslinkable polymeric binders, one or more ethylenically unsaturated, photopolymerizable low molecular weight compounds, one or more photopolymerization initiators and, if required, other additives and/or assistants, for example thermal polymerization inhibitors, plasticizers, leveling agents, fillers and the like. Examples of these are the photopolymerizable mixtures which can be washed out with water/alcohol developers and contain one or more soluble nylons or nylon copolymers as the binder, one or more ethylenically unsaturated, low molecular weight compounds which possess two or more photopolymerizable double bonds and are compatible with the binder, one or more photoinitiators and, if required, other additives and/or assistants of the stated type, as described in, for example, FR-A-15 20 856 or DE-A-22 02 357.

Particularly advantageous photosensitive recording elements are those which possess a water-developable photosensitive recording layer consisting of a photopolymerizable mixture based on water-soluble or water-dispersible polymeric binders, as described in, for example, British Patent Nos. 834,337, 1,233,883, 1,351,475, 786,119, 814,227 and 835,849, U.S. Pat. Nos. 3,801,328, 3,877,939 and 4,272,611, DE-A-31 44 905, EP-A-70 510, EP-A-70 511 or EP-A-129 901. Examples of polymers which may be present in these photopolymerizable mixtures are the known homo or copolymers of N-vinylpyrrolidone which are soluble or dispersible in water, examples of comonomers being vinyl esters, such as vinyl acetate. Hydrolysed N-vinylpyrrolidone/vinyl ester copolymers are also suitable. Binders which have proven particularly advantageous for these photopolymerizable mixtures are vinyl alcohol polymers possessing —$CH_2CH(OH)$ structural units in the polymer main chain, as well as their copolymers and derivatives, such as esters, ethers or acetals, which are soluble or dispersible in water or aqueous solvents. The known partially hydrolysed polyvinyl esters of aliphatic monocarboxylic acids of 1 to 4 carbon atoms, such as polyvinyl acetates or polyvinyl propionates, whose mean degree of polymerization is from about 200 to 3000 and whose degree of hydrolysis is 65–99, in particular about 80–88, mol %. Mixtures of hydrolysed vinyl ester polymers or vinyl ester copolymers having different degrees of polymerization and/or different degrees of hydrolysis may also be used. Other examples of polymers in this context are the reaction products of vinyl alcohol polymers with acrylic and/or methacrylic anhydride, these reaction products generally containing from 1 to 12 mol %, based on the reaction product, of incorporated acryloyl and/or methacryloyl groups, as well as the water-soluble reaction products of vinyl alcohol polymers with ethylene oxide, the amount of ethylene oxide units in the oxyethylated vinyl alcohol polymer being from 5 to 75, in particular from 10 to 60, % by weight. These reaction products of vinyl alcohol polymers may be present in the photopolymerizable mixtures as the sole polymer component or as a mixture with other compatible polymers, in particular the abovementioned partially hydrolyzed polyvinyl esters.

If the photopolymerizable mixtures contain polymers possessing ethylenically unsaturated photopolymerizable or photocrosslinkable groups, the addition of photopolymerizable, ethylenically unsaturated low molecular weight compounds to the photopolymerizable mixtures is not absolutely essential but is frequently advantageous.

Examples of the photopolymerizable, ethylenically unsaturated low molecular weight compounds are, in particular, the low molecular weight compounds containing acryloyl and/or methacryloyl groups, including mono-, di- and poly(meth)acrylates, as obtained by esterification of acrylic acid or methacrylic acid with low molecular weight monohydric or polyhydric alcohols, e.g. the di-and tri(meth)acrylates of ethylene glycol, diethylene glycol, triethylene glycol, polyethylene glycols having a molecular weight of up to about 500, propane-1,2-diol, propane-1,3-diol, polypropylene glycols having a molecular weight up to about 500, 2,2-dimethylpropanediol, butane-1,4-diol, 1,1,1-trimethylolpropane, glycerol or pentaerythritol, as well as the monoacrylates and monomethacrylates of such diols or polyols, e.g. ethylene glycol mono(meth)acrylate, propanediol mono(meth)acrylate and di-, tri-and tetraethylene glycol mono(meth)acrylate; the (meth)acrylates of monoalkanols of 1 to 8 carbon atoms, (meth)acrylamide and mono—and bis(meth)acrylamides of aliphatic or aromatic diamines of 2 to 8 carbon atoms, derivatives of (meth)acrylamides, e.g. hydroxymethyl(meth)acrylamide and, in particular, the reaction product of 2 moles of N-hydroxymethyl(meth)acrylamide with one mole of an aliphatic diol, e.g. ethylene glycol or propylene glycol, and low molecular weight urethane-containing acrylate or methacrylate compounds.

The choice of the photopolymerizable, ethylenically unsaturated compounds depends in a known manner on the polymers present in the photopolymerizable mixtures and on the intended use of the photosensitive recording elements. It is familiar to the skilled worker and described in, inter alia, the publications cited above. The photopolymerizable mixtures contain the polymers and the photopolymerizable ethylenically unsaturated low molecular weight compounds in general in an amount of about 40–90% by weight and 10–60% by weight, respectively, based on the sum of the polymers and the said compounds in each case. The amount of the said compounds may be higher or lower in individual cases. For example, it is possible to reduce the amount of photopolymerizable, ethylenically unsaturated low molecular weight compounds to below 10% by weight if the photopolymerizable mixture contains unsaturated polymers having a sufficiently high content of photopolymerizable or photocrosslinkable double bonds; it may also be above 60% by weight, for example when photopolymerizable oligomers are used, provided that the photosensitive recording layer is solid at room temperature.

Suitable photopolymerization initiators, which are present in the photopolymerizable mixture in general in an amount of from 0.05 to 10, in particular from 0.5 to 5, % by weight, based on the said mixture, are the conventional photopolymerization initiators. Examples of these are benzoin, benzoin ethers, in particular benzoin alkyl ethers, substituted benzoins, and alkyl ethers of substituted benzoins, for example α-methylbenzoin alkyl ethers or α-hydroxymethylbenzoin alkyl ethers; benzil and benzil ketals, in particular benzil dimethyl ketal; the acylphosphine oxide compounds which are known, effective photoinitiators, e.g. 2,4,6-trimethylbenzoyldiphenylphosphine oxide; benzophenone and its derivatives, Michlers ketone and its derivatives; anthraquinone and substituted anthraquinones, aryl-substituted imidazoles and their derivatives, for example 2,4,5-triarylimidazole dimers and the like. The photopolymerizable mixtures for the photosensitive recording layers may furthermore contain the abovementioned conventional additives and/or assistants in the conventional, effective amounts. In particular, the types and amounts of the components must be matched up with one another so that the said recording layer of the novel photosensitive recording elements is solid at room temperature.

Particularly where they are used for the production of printing plates or relief plates, the said recording elements may furthermore contain, between the dimensionally stable base and the photosensitive recording layer, one or more intermediate layers which are, in particular, in the form of an adhesion-promoting layer and/or an antihalation layer. These intermediate layers are generally polymeric layers, which may or may not be photosensitive. Adhesion-promoting layers generally contain the same polymer as that constituting the polymeric binder in the photosensitive recording layer, or a similar polymer. Examples of suitable adhesion-promoting intermediate layers are those based on polyurethanes, polyvinyl alcohols or polyvinyl alcohol derivatives, nylons, epoxy resins, melamine/formaldehyde resins and the like, as described in, inter alia, DE-A-15 97 515, U.S. Pat. No.3,877,939, EP-A-53 258, EP-A-53 260, EP-A-2 321, U.S. Pat. Nos. 4,387,157, U.S. Pat. 4,355,093 or 4,357,414. These intermediate layers may also contain polymerizable monomers, for example hydroxyalkyl (meth)acrylates or urethane (meth)acrylates, as well as a photoinitiator. If the intermediate layers are in the form of antihalation layers in order to prevent excessive and undesirable reflection of the incident light by the dimensionally stable base during imagewise exposure of the photosensitive recording layer, these intermediate layers contain dyes and/or pigments which absorb light in the actinic wavelength range.

Since the dyes present, according to the invention, in the photosensitive recording elements exhibit little or no migration and furthermore the photochemical properties of the said recording elements containing these dyes therefore do not change even on prolonged storage, it is possible according to the invention, and also particularly advantageous for controlling the exposure properties of the photosensitive recording elements and of the photochemical processes therein, if the dyes contained, according to the invention, in the photosensitive recording layer and/or any intermediate layers are present in graded concentrations over the thickness of the recording element, i.e. from the outer surface of the said recording layer toward the base. Since the photochemical properties of the said recording elements can be controlled on the basis of various principles, the dyes present according to the invention in the photosensitive recording layer and/or any intermediate layers of the photosensitive recording elements may also be of different types.

For example, it may be desirable on the one hand, during imagewise exposure of the photosensitive recording elements, to reduce the intensity of the actinic light incident on the photosensitive recording layer from above, in a particular manner at various depths of the layer, and thus to suppress the light-initiated processes to different extents, depending on the depth of penetration. This has a substantial effect on, for example, the form and printing properties of a letterpress or gravure printing plate. In order to achieve this objective, the dyes used according to the invention can be present in the photosensitive recording layer in concentrations which are graded over the thickness of the said layer. This can be achieved, for example, if the photosensitive recording layer consists of two or more strata which contain the dye or dyes in different concentrations. Moreover, the dye concentration may be 0 in one or more of these strata of the said recording layer, i.e. individual strata of a multistratum photosensitive recording layer need not contain any dye, provided that one or more strata of the multistratum photosensitive recording layer contains a dye used according to the invention. In general, the dye concentration in the individual strata of the said recording layer either increases or decreases from the outer surface of the said recording layer toward the dimensionally stable base. The same principle can also be realized with a single-stratum photosensitive recording layer if the latter contains the dyes used according to the invention in a concentration gradient running from the outer surface of the said recording layer to the dimensionally stable base.

In other cases, the actinic light penetrating the photosensitive recording layer when the photosensitive recording element is exposed imagewise is intended to be attenuated as little as possible during passage through the said recording layer. Particularly where nontransparent dimensionally stable bases or light-scattering intermediate layers, for example pigment-containing ones, are used, this is also intended to prevent the actinic light incident imagewise from being transmitted back, by reflection and/or scattering at the base or in an intermediate layer, into regions of the photosensitive recording layer which are intended to remain unexposed. During the production of letterpress printing plates, reflection and scattering are evident from the fact that the shadow well depths are not sufficiently well formed, often having a substantial adverse effect on the printing process. In these cases, the photosensitive recording layer does not contain any dye or only contains dyes in a low concentration, in which case the dyes are preferably distributed uniformly in the said recording layer, and the dyes used according to the invention are present in the base of the photosensitive recording layer. This is effected in general and most simply by incorporating the said dyes in this case into an intermediate layer between the dimensionally stable base and the photosensitive recording layer, the said intermediate layer preferably being arranged directly adjacent to the said recording layer.

It is of course also possible for the dyes present according to the invention in the photosensitive recording elements to be contained both in the photosensitive recording layer and in one or more intermediate layers which may be present, in particular in different concentrations in the individual layers, the concentration of the dyes in the intermediate layer or layers generally being higher than that in the photosensitive recording layer. In this case, the dye in the said recording layer may be either homogeneously distributed or present in graded concentrations over the thickness of the layer. In the case of photosensitive recording elements which contain a plurality of intermediate layers between the dimensionally stable base and the photosensitive recording layer, it is possible for the dyes used according to the invention to be present in only one, a plurality or all of these intermediate layers. It has proven advantageous, but not at all essential, for the dyes used according to the invention to be present in the intermediate layer directly adjacent to the photosensitive recording layer. Moreover, a very wide range of variations is of course possible with regard to coloring the photosensitive recording elements in a manner described above with the dyes used according to the invention, as well as other principles of inhomogeneous or discontinuous coloring of the photosensitive recording layer and/or of any intermediate layers present.

The novel photosensitive recording elements may furthermore contain, on the outer surface of the photosensitive recording layer, i.e. on that surface which faces away from the dimensionally stable base, a top layer which is preferably soluble in the same developer as the photosensitive recording layer, and/or a cover sheet which can be peeled off from the photosensitive recording layer or from any top layer present. Such top layers and cover sheets serve in particular to protect the photosensitive recording layer during storage and handling of the photosensitive recording elements and, if desired, as an oxygen barrier, particularly where the photosensitive recording layer consists of a photopolymerizable mixture. For example, top layers and cover sheets of polyvinyl alcohols or their derivatives, polyolefins, polyesters or the like have proven particularly useful.

The novel photosensitive recording elements can be produced in a conventional manner. For example, a homogeneous mixture of the components forming the photosensitive recording layer can be prepared and then applied as a layer on the dimensionally stable base, which may have been provided with one or more intermediate layers. The components of the said layer can be mixed in a suitable mixing apparatus, for example a mixer or extruder, or in solution in a suitable solvent or solvent mixture. Coating of the dimensionally stable base, which may or may not be provided with the intermediate layer or layers, with the photosensitive recording material can be effected, for example, by lamination of a preprepared layer of the photosensitive recording material, or from solution by casting, immersion, spraying or another application technique, followed by evaporation of the solvent. In the case of multistratum photosensitive recording layers, the individual strata can be arranged one on top of the other in succession by application from solution; however, it is also possible to preprepare the individual strata of the said recording layer and then connect them to one another in the desired sequence, for example by lamination. In the case of photosensitive recording elements which contain one or more intermediate layers between the base and the photosensitive recording layer, these intermediate layers can likewise be applied to the base in a conventional manner, for example by application from solution or by lamination. The dyes present according to the invention in the photosensitive recording elements are incorporated into the materials for the individual layers or, in the case of multistratum recording layers, the materials for the individual strata of the recording layer. A photosensitive recording element in which the dye has a concentration gradient in a single-stratum photosensitive recording layer can be produced, for example, by allowing the dye to diffuse, from a solution applied on one side, and if necessary at elevated temperatures, into the photosensitive recording layer which has been freshly cast from solution and still has a high solvent content. The concentration gradient of the dye can be established by diffusion, before the solvent is removed in the subsequent drying process, by using a multilayer casting apparatus by means of which two or more photosensitive strata having different dye concentrations but otherwise of identical composition are cast in one operation. This process can also be promoted by intentional partial mixing of adjacent strata in the boundary zones. The latter procedure is of course also possible in the case of coextrusion of two or more strata having different dye concentrations. Any top layer and/or cover sheet present can be applied subsequently to the photosensitive recording layer; however, it is also possible first to produce the photosensitive recording layer on the cover sheet or top layer, for example by application from solution, and then to join the laminate reproduced in this manner and consisting of a top layer or cover sheet and the photosensitive recording layer to the base, which may have been provided beforehand with the intermediate layer or layers.

The novel photosensitive recording elements are useful, for example, for the production of resist layers having an imagewise structure and resist images, and in particular for the production of printing plates and relief plates. The said recording elements can be processed in a conventional manner to give printing plates, by subjecting them, if necessary, to preexposure and then exposing them imagewise to actinic light through a suitable transparency and developing them, for example by washing them out with a suitable developer. Printing plates, relief plates or resist images produced in this manner can then be subjected to an after-treatment, including, in particular, drying and/or non-imagewise postexposure. The conventional light sources emitting actinic radiation, in particular in the wavelength range from about 300 to 400 nm, e.g. UV fluorescent tubes, high pressure, medium pressure and low pressure mercury lamps, superactinic fluorescent tubes, pulsed xenon lamps, UV lasers and the like, are suitable for preexposure, imagewise exposure and postexposure. The said recording elements possess good and advantageous photochemical properties which are not altered or adversely affected even on prolonged storage. When the novel photosensitive recording elements are used, image-bearing originals can be reproduced exactly and faithfully to the original, and the exposure properties and structures of the resulting reliefs can be established simply and in the desired manner.

The Examples which follow illustrate the invention. Parts and percentages are by weight, unless stated otherwise.

EXAMPLES 1 TO 6 AND COMPARATIVE EXPERIMENTS A AND B

Mixtures of 98.5% of a partially hydrolyzed polyvinyl acetate (degree of hydrolysis 82 mol %, molecular weight about 25,000) and 1.5% of the particular dye stated in Table 1 below were applied from solution onto aluminum sheets in such a way that, after drying at from 100° to 150° C., a 10 μm thick antihalation layer resulted. The dyes used in Examples 4 to 6 were dyes of the formula (V).

To prepare a photopolymerizable, photosensitive recording layer, a solution of 48 parts of butane-1,4-diol dimethacrylate, 3.8 parts of 2,4,6-trimethylbenzoyldiphenylphosphine oxide and 1.0 part of 2,6-di-tert.-butyl-p-cresol in 281 parts of 2-hydroxyethyl methacrylate was added to a solution of 222 parts of a partially hydrolyzed polyvinyl acetate (degree of hydrolysis 83 mol %, $M_w$ about 30,000) and 95 parts of a partially hydrolyzed polyvinyl acetate which contained 22% of polyoxyethylene segments ($M_w$: from 25,000 to 30,000) in 318 parts of water. The solution thus obtained was filtered and degassed and then cast to give a photosensitive, photopolymerizable layer, which was about 500 μm thick after drying.

The photosensitive, photopolymerizable layer produced in this manner was laminated with the antihalation layers on the aluminum sheets under a pressure of 1N/cm². The resulting photosensitive recording elements were stored at room temperature, the diffusion of the various dyes into the photosensitive, photopolymerizable layers being assessed visually after 7 days and 250 days. The results are likewise shown in Table 1. As can be seen from these results, little or no migration was detectable in the case of the dyes used according to the invention, whereas other sulfo-containing dyes, as recommended in the prior art for photosensitive recording elements, are found to have migrated to a pronounced extent into the photopolymerizable, photosensitive recording layer after storage for a short time.

TABLE 1

| Example/ Comparative Experiment | Dye | Migration into the photopolymerizable recording layer after | |
|---|---|---|---|
| | | 7 days | 250 days |
| 1 | dye of the formula (II) | virtually none | virtually none |
| 2 | dye of the formula (III) | virtually none | virtually none |
| 3 | Direct Yellow 11 (C.I. 40 000) | extremely little | extremely little |
| 4 | Dye 5783 A | extremely little | extremely little |
| 5 | Dye 5783 B | none | none |
| 6 | Dye 5783 C | virtually none | virtually none |

A C.I. Acid Black 1 very pronounced (C.I. 20 470)
B C.I. Acid Violet 19 very pronounced (C.I. 42 685)

EXAMPLE 7

A 71% strength aqueous solution was prepared from 67.5 parts of a polyvinylpyrrolidone having a mean molecular weight (weight average) of from 600,000 to 800,000 (K value 92), 30 parts of the diether obtained from 1 mole of ethylene glycol and 2 moles of N-hydroxymethylacrylamide, 0.1 part of N-nitrosocyclohexylhydroxylamine and 2.5 parts of α-methylolbenzoin methyl ether. This solution was cast to give a photosensitive, photopolymerizable layer which was 500 μm thick after drying at elevated temperatures. This layer was then laminated with an aluminum sheet which had been treated by the alodine process and provided with a 10 μm thick adhesion-promoting layer. The last-mentioned layer had been formed by applying an aqueous methanolic solution of the same polymer as that used for the production of the photosensitive, photopolymerizable recording layer, with the addition of the dye of the general formula (II), evaporating off the solvent and baking the layer at elevated temperatures. The amount of dye was chosen so that the latter was present in the baked adhesion promoting layer in an amount of 2%.

The photosensitive recording element produced in this manner was exposed imagewise to actinic light and the unexposed parts of the photosensitive recording layer were washed out with water to give print reliefs whose nonprinting areas possessed adequate depths. The exposure properties of the said recording element were unchanged after storage for 3 months.

EXAMPLE 8

174 parts of a 60:40 N-vinylpyrrolidone/vinyl acetate copolymer having a K value of 32 and 75 parts of a partially hydrolyzed polyvinyl acetate which contained 22% of bonded polyoxyethylene segments and had a weight average molecular weight of from 25,000 to 30,000 were dissolved in 210 parts of demineralized water. 6.0 parts of α-methylolbenzoin methyl ether, 0.1 part of N-nitrosocyclohexylhydroxylamine and 0.015 part of eosin in 45 parts of 1,1,1-trimethylolpropane triacrylate were then stirred in. A 500 μm thick photosensitive, photopolymerizable layer was prepared from this solution, as in Example 1, and this layer was applied to an aluminum sheet provided with an adhesion-promoting layer which was 8 μm thick and contained 4% of the dye of the formula (IV). The photosensitive recording element thus produced was exposed imagewise to actinic light in a conventional manner and then developed to give a printing plate. The resulting printing plate had a very good relief structure.

EXAMPLE 9

1,036 parts of a partially hydrolyzed polyvinyl acetate (degree of hydrolysis 82 mol %, mean degree of polymerization 500-600) were dissolved in 1,050 parts of demineralized water. Thereafter, a solution of 37 parts of tetraethylene glycol dimethacrylate, 29 parts of benzil dimethyl ketal, 2.9 parts of 2,6-di-tert.-butyl-p-cresol and 0.1 part of eosin in 880 parts of 2-hydroxyethyl methacrylate was added. The resulting solution was cast to give a photosensitive photopolymerizable layer, which was about 500 μm thick after evaporation of the solvent and drying. The said layer was laminated with a steel sheet provided with a 10 μm thick adhesion-promoting layer containing 3% of the dye Direct Yellow 11 (C.I. 40,000). After the photosensitive, photopolymerizable recording layer of the recording element thus prepared had been exposed imagewise and the unexposed parts of the layer had been washed out with water, a relief printing plate having good shadow well depths was obtained.

EXAMPLE 10

400 parts of a partially hydrolyzed polyvinyl acetate having a degree of hydrolysis of 83 mol % and a weight average molecular weight of about 30,000 and 171 parts of a partially hydrolyzed polyvinyl acetate which contained 22% of bonded polyoxyethylene segments and had a weight average molecular weight of about 25,000-30,000 were dissolved in 573 parts of demineralized water. Thereafter, 86.5 parts of butane-1,4-diol dimethacrylate, 6.8 parts of 2,4,6-trimethylbenzoyldiphenylphosphine oxide and 1.8 parts of 2,6-di-tert.-butyl-p-cresol in 506 parts of 2-hydroxyethyl methacrylate were added. The photosensitive, photopolymerizable layer cast from this solution was about 500 μm thick after evaporation of the solvent and drying.

Photosensitive, photopolymerizable layers produced in the above manner were laminated with aluminum sheets, each of which was provided with an adhesion-promoting layer. These layers, each of which was 10 μm thick, were formed from a mixture of 80% of the partially hydrolyzed polyvinyl acetate present in the photosensitive, photopolymerizable recording layer (degree of hydrolysis 83 mol %, $M_w$ about 30,000) and 20% of 2-hydroxyethyl methacrylate and were baked. The adhesion-promoting layers contained different amounts of the dye Direct Yellow 11 (C.I. 40,000).

The photosensitive recording elements thus obtained were first preexposed uniformly for a short time in a commercial exposure unit containing a doped 5 kW mercury lamp and then exposed imagewise in a principal exposure step. The minimum exposure times required to produce a good relief structure were determined. The dye concentrations in the adhesion-promoting layers, the minimum exposure time determined and the shadow well depths measured in the resulting relief plates, both in the half tone area and at a negative point, are summarized in Table 2. As Table 2 shows, a concentration of the dye in the adhesion-promoting layer of only 2% is sufficient to give excellent shadow well depths in the negative image elements.

TABLE 2

| Dye concentration [%] | Minimum exposure time (preexposure/ principal exposure) [sec] | Shadow well depths [μm] | |
|---|---|---|---|
| | | 60 percent screen (32 L/cm) | negative point, diameter 400 μm |
| 0 | 2/25 | 17 | 41 |
| 2 | 2/25 | 130 | 234 |
| 4 | 2.2/33 | 132 | 274 |
| 6 | 2.2/38 | 134 | 268 |
| 8 | 2.5/38 | 130 | 267 |

EXAMPLE 11

The formulation used in Example 10 was employed to produce a photosensitive, photopolymerizable layer, which in this case however consisted of 2 strata, the lower, 100 μm thick stratum additionally containing 0.2% of the dye Direct Yellow 11 (C.I. 40,000). The upper, 400 μm thick stratum of the photosensitive, photopolymerizable recording layer did not contain any dye. The exposure behavior of the said recording layer was independent of the type of base used and the adhesion-promoting layer on the base, and corresponded to that of the recording element containing 2% of dye in the adhesion-promoting layer of Example 10.

We claim:

1. An improved negative-working photosensitive recording element for the production of printing plates, said element comprising
   (a) a dimensionally stable base,
   (b) a photopolymerizable recording layer comprising a polymeric binder, a photopolymerizable ethylenically unsaturated compound and a photoinitiator, and
   (c) an intermediate layer between the base and the recording layer, said element containing a dye in the photopolymerizable recording layer or in the intermediate layer,
   the improvement comprising using as the dye, at least one migration-resistant sulfo-containing azo or azoxy dye in an amount effective to permit predetermined control of exposure, said sulfo-containing azo or azoxy dye being of the formula (I)

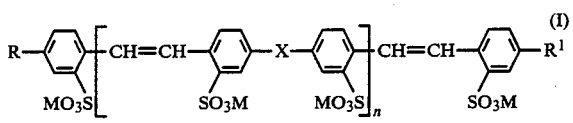

wherein
X is an azo or azoxy group;
M is hydrogen, an alkali metal cation, ammonium or an amine cation;
R and $R^1$ are identical or different and independently of one another are each —$NO_2$, —$NH_2$, —NHCOR$^2$, —NHSO$_2$R$^3$ or —N=N—R$^4$, in which R$^2$ is hydrogen, unsubstituted or substituted alkyl, unsubstituted or substituted cycloalkyl, unsubstituted or substituted phenyl, alkoxy, phenoxy, a 5-membered or 6-membered heteroaromatic radical, —$NH_2$ or —COOH, R$^3$ is alkyl or phenyl and R$^4$ is a radical of a coupling component; and n is an integer from 1 to 6 or, where one or both of R or $R^1$ is —N=N—R$^4$, n is an integer of from 0 to 6.

2. The photosensitive recording element of claim 1, wherein at least one of the radicals R and $R^1$ of said dye of the formula (I) is —$NO_2$.

3. The photosensitive recording element of claim 1, wherein at least one of the radicals R and $R^1$ of said dye of the formula (I) is —$NH_2$.

4. The photosensitive recording element of claim 1, wherein at least one of the radicals R and $R^1$ of said dye of the formula (I) is —NHCOR$^2$, in which R$^2$ is alkyl or unsubstituted or substituted phenyl.

5. The photosensitive recording element of claim 1, wherein at least one of the radicals R and $R^1$ of said dye of the formula (I) is —N=N—R$^4$, in which R$^4$ is a radical of a watersoluble coupling component.

6. The photosensitive recording element of claim 5, wherein the radical R and $R^1$ of said dye of the formula (I), are each —N=N—R$^4$, in which R$^4$ is a radical of a water-soluble coupling component of the benzene or naphthalene series.

7. The photosensitive recording element of claim 3, wherein n of the dye of the formula (I) is an integer of from 1 to 3.

8. The photosensitive recording element of claim 5, wherein n of the dye of the formula (I) is zero.

9. The photosensitive recording element of claim 1, wherein the dye of the formula (I) is present in the recording layer.

10. The photosensitive recording element of claim 1, wherein the dye of the formula (I) is present in the intermediate layer.

11. The photosensitive recording element of claim 9, wherein the dye is present in the recording layer in concentrations graded over the thickness of said recording layer.

12. The photosensitive recording element of claim 11, wherein the recording layer is a multistratum recording layer having a plurality of strata, the dye being present in different concentrations, including zero, in adjacent strata of the recording layer.

13. The photosensitive recording layer of claim 11, wherein the dye concentration decreases over the thickness of the recording layer, from the base to the outer surface of the recording layer.

* * * * *

UNITED STATES PATENT AND TRADEMARK OFFICE
CERTIFICATE OF CORRECTION

PATENT NO. : 4,948,702

DATED : August 14, 1990

INVENTOR(S) : Guenter WALLBILLICH

It is certified that error appears in the above-identified patent and that said Letters Patent is hereby corrected as shown below:

ON THE COVER PAGE

Foreign Application Data

"February 20, 1987" should read --February 27, 1986--

Signed and Sealed this

Twenty-seventh Day of August, 1991

Attest:

HARRY F. MANBECK, JR.

Attesting Officer

Commissioner of Patents and Trademarks